US009119293B2

(12) United States Patent
Mycroft et al.

(10) Patent No.: US 9,119,293 B2
(45) Date of Patent: Aug. 25, 2015

(54) HOUSING FOR A PORTABLE ELECTRONIC DEVICE

(75) Inventors: Damian Mycroft, Coronado, CA (US); Chee Yee Wong, London (GB); Robert John Lihou, Kent (GB); Mark Newman, Hillerod (DK)

(73) Assignee: Nokia Technologies Oy, Espoo (FI)

( * ) Notice: Subject to any disclaimer, the term of this patent is extended or adjusted under 35 U.S.C. 154(b) by 190 days.

(21) Appl. No.: 13/635,548

(22) PCT Filed: Mar. 18, 2010

(86) PCT No.: PCT/IB2010/051190
§ 371 (c)(1),
(2), (4) Date: Jan. 9, 2013

(87) PCT Pub. No.: WO2011/114190
PCT Pub. Date: Sep. 22, 2011

(65) Prior Publication Data
US 2013/0107433 A1 May 2, 2013

(51) Int. Cl.
H05K 5/00 (2006.01)
H05K 7/00 (2006.01)
H04M 1/02 (2006.01)

(52) U.S. Cl.
CPC ........... *H05K 5/0086* (2013.01); *H04M 1/0249* (2013.01); *H04M 1/0268* (2013.01); *H05K 5/0017* (2013.01)

(58) Field of Classification Search
USPC ........... 361/679.27, 679.41, 679.56; 206/701, 206/703, 722, 724; 455/575.1–575.9
See application file for complete search history.

(56) References Cited

U.S. PATENT DOCUMENTS

| 5,295,522 | A * | 3/1994 | DeAngelis et al. ............. 141/98 |
| 6,747,713 | B1 | 6/2004 | Sato ............................... 349/58 |
| 6,771,237 | B1 | 8/2004 | Kalt ................................. 345/85 |
| 8,502,788 | B2 | 8/2013 | Cho et al. ....................... 345/173 |
| 2002/0042285 | A1 | 4/2002 | Sakata et al. ................... 455/550 |
| 2003/0111366 | A1 | 6/2003 | Enners ........................... 206/305 |
| 2006/0268528 | A1 * | 11/2006 | Zadesky et al. ............... 361/728 |
| 2007/0261978 | A1 * | 11/2007 | Sanderson ..................... 206/320 |
| 2008/0227507 | A1 | 9/2008 | Joo .............................. 455/575.8 |
| 2009/0036208 | A1 | 2/2009 | Pennington et al. ............ 463/33 |
| 2009/0164035 | A1 * | 6/2009 | Zadesky et al. ................. 700/94 |
| 2009/0185344 | A1 * | 7/2009 | Zadesky et al. ........... 361/679.56 |
| 2009/0312063 | A1 | 12/2009 | Soto Nicolas ................ 455/566 |
| 2010/0038107 | A1 | 2/2010 | Su et al. .......................... 174/50 |
| 2010/0053861 | A1 | 3/2010 | Kim et al. ................. 361/679.01 |
| 2010/0117975 | A1 | 5/2010 | Cho ................................ 345/173 |
| 2010/0156887 | A1 | 6/2010 | Lindroos et al. .............. 345/418 |
| 2010/0253902 | A1 | 10/2010 | Yamazaki et al. ............. 349/158 |
| 2011/0151935 | A1 | 6/2011 | Oksman et al. ................ 455/566 |
| 2012/0096373 | A1 | 4/2012 | Aguera y Arcas et al. ... 715/764 |
| 2012/0235893 | A1 | 9/2012 | Phillips et al. ................. 345/156 |

FOREIGN PATENT DOCUMENTS

| CN | 1893786 A | 1/2007 |
| EP | 0 878 942 A2 | 11/1998 |
| EP | 1 313 296 A2 | 5/2003 |
| EP | 2 220 998 A1 | 8/2010 |
| KR | 20-0194785 | 9/2000 |
| KR | 20000058043 A | 9/2000 |
| KR | 10-2008-0084494 A | 9/2008 |
| KR | 10-0934120 | 12/2009 |
| KR | 10-2010-0027546 A | 3/2010 |
| KR | 20100052227 A | 5/2010 |
| TW | 200924715 A | 6/2009 |
| WO | WO-2007/053368 A2 | 5/2007 |

* cited by examiner

*Primary Examiner* — Anthony Haughton
(74) *Attorney, Agent, or Firm* — Harrington & Smith

(57) ABSTRACT

A housing for a portable electronic device including a first transparent curved portion configured to curve from a front face of the housing to a first side face of the housing; a second transparent curved portion configured to curve from the front face of the housing to a second side face of the housing; a third transparent curved portion configured to curve from a rear face of the housing to the first side face of the housing; and a fourth transparent curved portion configured to curve from the rear face of the housing to the second side face of the housing.

20 Claims, 9 Drawing Sheets

HOUSING FOR A PORTABLE ELECTRONIC DEVICE

FIELD OF THE INVENTION

Embodiments of the present invention relate to a housing. In particular, they relate to a substantially transparent housing for a portable electronic device.

BACKGROUND TO THE INVENTION

A conventional portable electronic device has a housing made from a colored plastics material. The housing may have a front face comprising apertures for a display and keys, and a rear face comprising an aperture for a camera.

BRIEF DESCRIPTION OF VARIOUS EMBODIMENTS OF THE INVENTION

According to some, but not necessarily all, embodiments of the invention, there is provided a housing for a portable electronic device comprising: a first transparent curved portion configured to curve from a front face of the housing to a first side face of the housing; a second transparent curved portion configured to curve from the front face of the housing to a second side face of the housing; a third transparent curved portion configured to curve from a rear face of the housing to the first side face of the housing; and a fourth transparent curved portion configured to curve from the rear face of the housing to the second side face of the housing.

Each of the first, second, third and fourth transparent curved portions may have a convex curvature. The first and second side faces of the housing may extend along the length of the housing. The distance between the first side face and the second side face may define the width of the housing.

The distance between the front face and the rear face may define the depth of the housing, and the depth is smaller than the width.

The housing may further comprise a front wall providing the front face and positioned intermediate the first transparent curved portion and the second transparent curved portion. The front wall, the first transparent curved portion and the second transparent curved portion may be integrally formed.

At least a portion of the front face may be substantially flat. At least a portion of the front face may be curved.

The housing may further comprise a rear wall providing the rear face and positioned intermediate the third transparent curved portion and the fourth transparent curved portion. The rear wall, the third transparent portion and the fourth transparent portion may be integrally formed.

The rear face may be substantially flat. At least a portion of the rear face may be curved.

The first transparent curved surface and the second transparent curved surface may be provided by a first half shell, the third transparent curved surface and the fourth transparent curved surface may be provided by a second half shell, and the first half shell may be joined to the second half shell at the first side face and the second side face.

The first half shell may be adhered directly to the second half shell at the first side face and the second side face. The first, second, third and fourth transparent curved portions may be made from transparent material.

Each of the first, second, third and fourth transparent curved portions may be made from the same transparent material. The transparent material may be smooth. The transparent material may be a plastics material or glass.

The housing may have an opening, at least partially defined by an outer rim of the first, second, third and fourth transparent curved portions. The housing may further comprise an end cap positioned to cover the opening and the outer rim.

The end cap may be configured to house an audio device. The end cap may comprise an aperture for the audio device. The housing may have a further opening, at least partially defined by a further outer rim of the first, second, third and fourth transparent portions, at a further end of the housing.

The housing may further comprise a further end cap positioned to cover the further opening and the further outer rim. The further end cap may be configured to house a further audio device. The further end cap may comprise an aperture for the further audio device.

According to some, but not necessarily all, embodiments of the invention, there is provided a portable electronic device comprising the housing as described above, and further comprising a display, viewable through the front face of the housing.

The display may have a first curved portion in register with the first transparent curved portion of the housing, and a second curved portion in register with the second transparent curved portion of the housing.

According to some, but not necessarily all, embodiments of the invention, there is provided a housing for a portable electronic device, comprising: a transparent shell having a length, a width and a depth, wherein the transparent shell comprises an opening at one end of the length; and an end cap configured to cover the opening, wherein the end cap comprises an aperture for an audio device.

The transparent shell may comprise an outer rim, substantially perpendicular to the length, defining the opening, and the end cap may be shaped to cover the outer rim defining the opening. The end cap may comprise a portion that extends into the transparent shell and holds the end cap in place.

The transparent shell may have a further opening at further end of the length, and the housing may further comprise a further end cap configured to cover the further opening. The further end cap may comprise a further aperture for a further audio device. The transparent shell may comprise an outer rim, perpendicular to the length, defining the further opening, and the end cap may be shaped to cover the outer rim defining the further opening.

The audio device may be a microphone and the further audio device may be a loudspeaker. The transparent shell may be wholly made from transparent material.

According to some, but not necessarily all, embodiments of the invention, there is provided a housing for a portable electronic device, comprising: a transparent shell having a length, a width and a depth, wherein the transparent shell comprises an opening at one end of the length, the opening being defined by an outer rim of the transparent shell; and an end cap positioned to cover the opening and the outer rim.

The outer rim may be substantially perpendicular to the length. The transparent shell may be made from a brittle material. The brittle material may be glass.

BRIEF DESCRIPTION OF THE DRAWINGS

For a better understanding of various examples of embodiments of the present invention reference will now be made by way of example only to the accompanying drawings in which.

DETAILED DESCRIPTION OF VARIOUS
EMBODIMENTS OF THE INVENTION

Figure 1A:
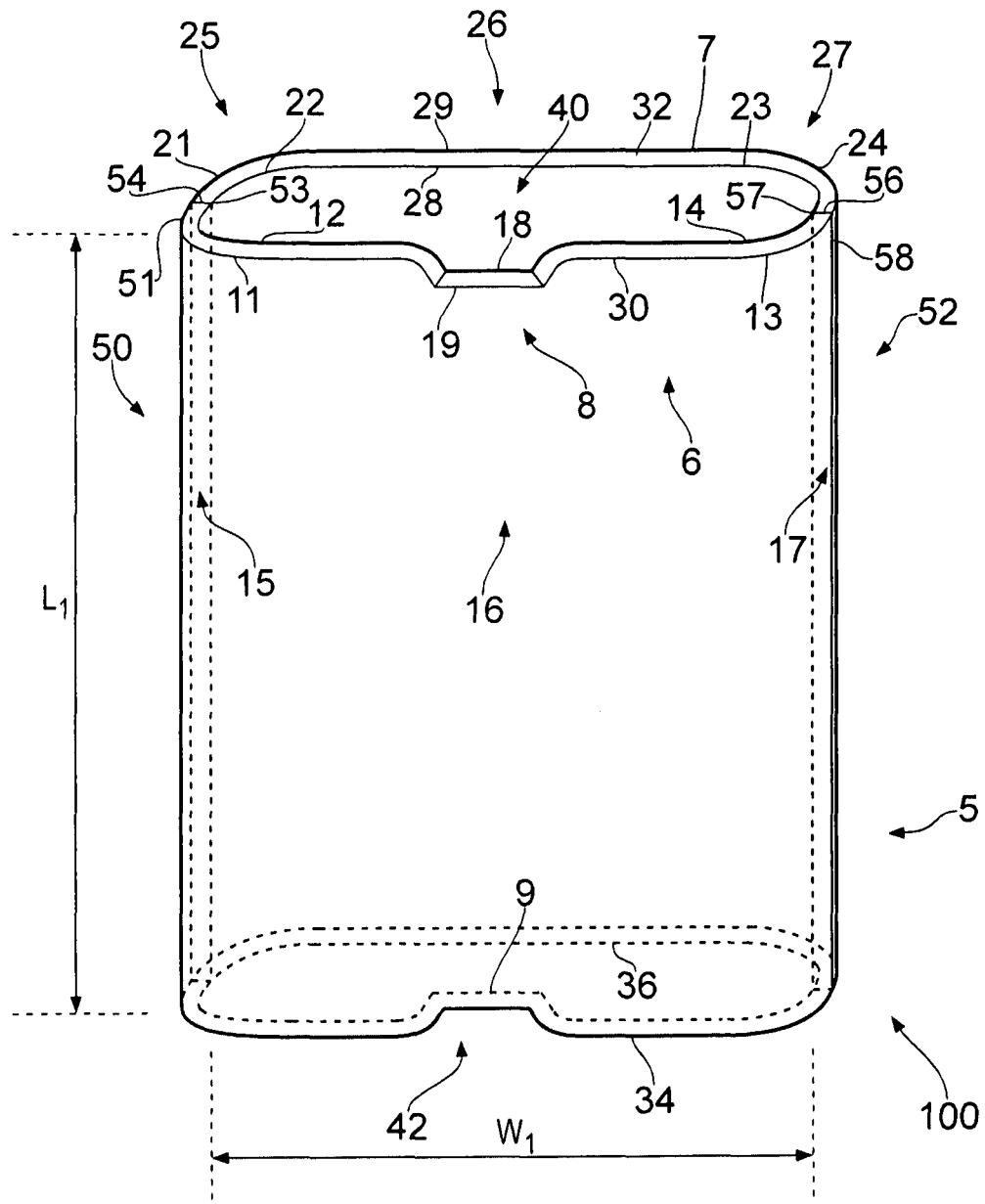
FIG. 1A illustrates a front view of a housing for a portable electronic device.
Figure 1B:
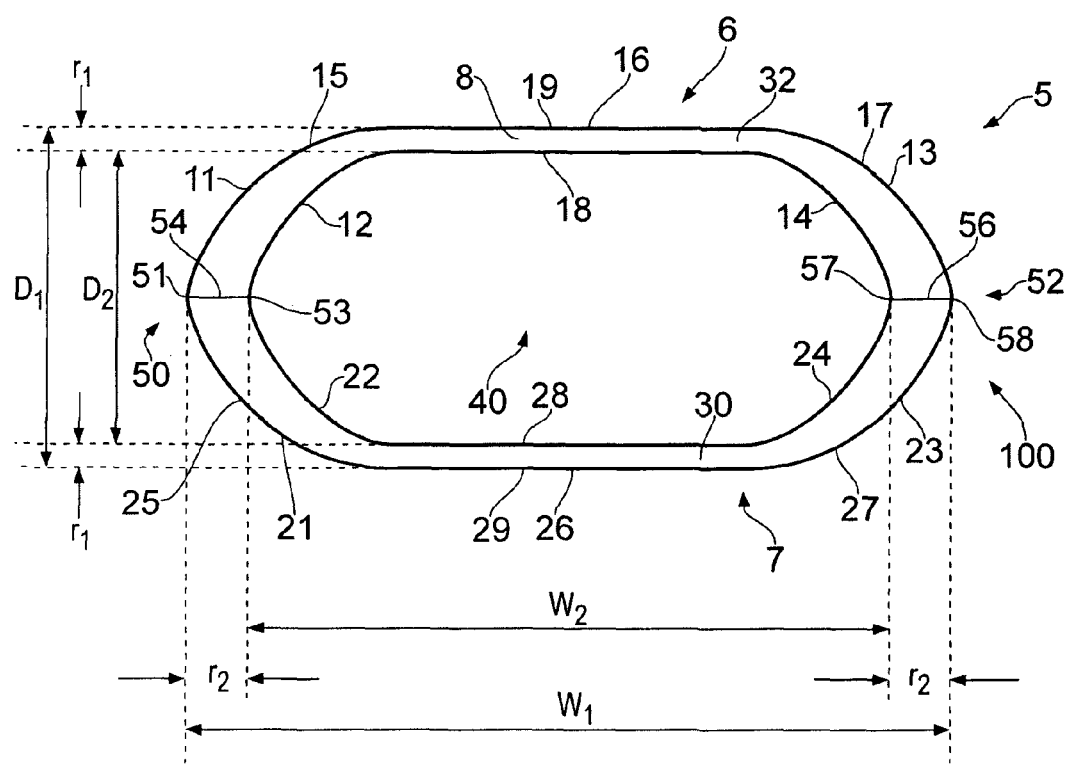
FIG. 1B illustrates a plan view of the housing.
Figure 1C:
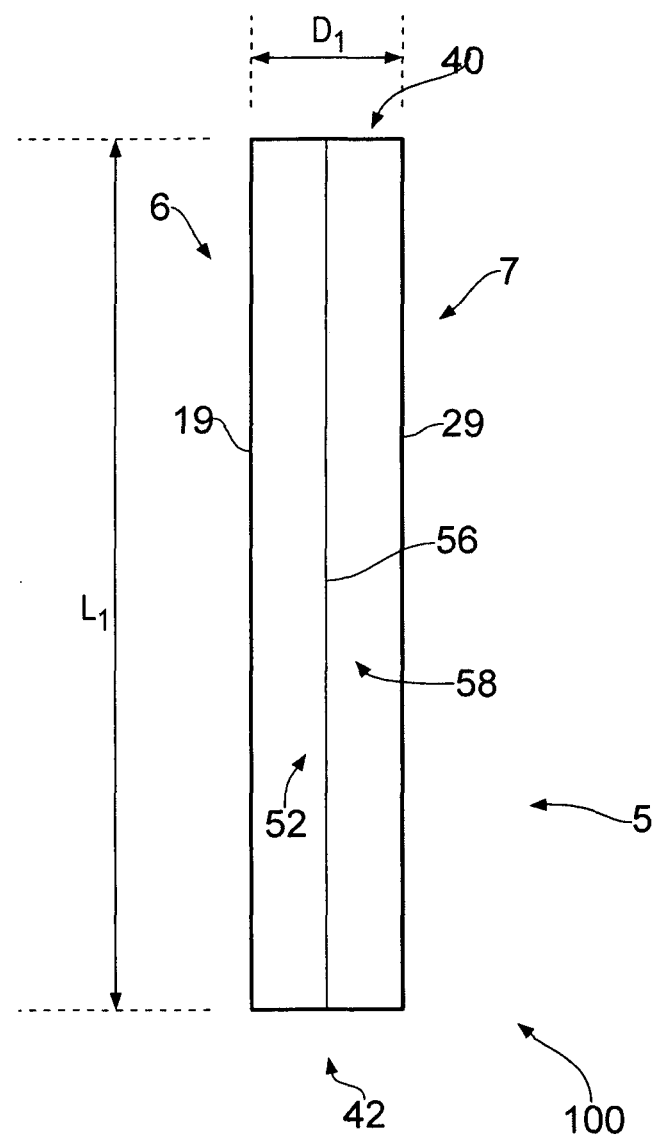
FIG. 1C illustrates a side view of the housing.

FIG. 1A illustrates a front view of a housing 100 for a portable electronic device. FIG. 1B illustrates a plan view of the housing 100. FIG. 1C illustrates a side view of the housing 100.

The portable electronic device may, for example, be a mobile telephone, a games console, a personal music player, a personal digital assistant or a tablet computer. The portable electronic device may be small enough to fit inside a user's pocket.

The housing 100 comprises a hollow, transparent shell 5 made from first and second half shells 6, 7. In the illustrated example, the first and second half shells 6, 7 are wholly made from a transparent, smooth material, such as glass or a transparent plastics material. Each half shell 6, 7 may be made from the same material. Each half shell 6, 7 is integrally formed.

The transparent shell 5 has a length $L_1$, a width $W_1$ and a depth $D_1$. The length $L_1$ is greater than the width $W_1$ and the depth $D_1$. The width $W_1$ is smaller than the length $L_1$ and greater than the depth $D_1$. The transparent shell 5 is tubular in shape and defines an inner space for housing electronic components of the portable electronic device.

The first half shell 6 comprises a first transparent curved portion 15, a transparent front wall 16 and a second transparent curved portion 17. The first transparent curved portion 15, the front wall 16 and the second transparent curved portion 17 are integrally formed.

In the example illustrated in FIGS. 1A, 1B and 1C, there are no apertures in the first transparent curved portion 15, the transparent front wall 16 and the second transparent curved portion 17. For example, there is no aperture for a display and there are no apertures for keys.

The front wall 16 is positioned intermediate the first transparent curved portion 15 and the second transparent curved portion 17. The front wall 16 comprises an inner surface 18 and an outer surface 19. The outer surface 19 of the front wall 16 provides the front face 19 of the housing 100. In the illustrated example, at least a portion of the front face 19 is substantially flat.

The first transparent curved portion 15 is configured to curve from the front wall 16 to a first side wall 50 of the housing 100. The first transparent curved portion 15 has an outer surface 11 and an inner surface 12. The outer surface 11 of the first transparent curved portion 15 has a convex curvature and curves from the front face 19 to an outer surface 51 of the first side wall 50, in plane defined by the depth $D_1$ and the width $W_1$ of the transparent shell 5. The outer surface 51 of the first side wall 50 provides a first side face 51 of the housing 100. In this example, a portion of the first side wall 50 is provided by the first transparent half shell 6, and a portion is provided by the second transparent half shell 7.

The inner surface 12 of the first transparent curved portion 15 has a convex curvature and curves from the inner surface 18 of the front wall 16 to an inner surface 53 of the first side wall 50, in a plane defined by the depth $D_1$ and the width $W_1$ of the transparent shell 5.

The arc of curvature of both the outer surface 11 and the inner surface 12 of the first transparent curved portion 15 increases as the first transparent curved portion 15 extends from the front wall 16 to the first side wall 50. In the illustrated first example, the arc of curvature of the inner surface 12 of the first transparent curved portion 15 increases at a faster rate than the arc of curvature of the outer surface 11, which means that the thickness of the first transparent curved portion 15 increases as it extends from the front wall 16 to the first side wall 50. Consequently, the thickness $r_2$ of the first side wall 50 is greater than the thickness $r_1$ of the front wall 16.

The second transparent curved portion 17 is configured to curve from the front wall 16 to a second side wall 52 of the housing 100. An outer surface 58 of the second side wall 52 provides a second side face 58 of the housing 100. In this example, a portion of the second side wall 52 is provided by the first transparent half shell 6, and a portion is provided by the second transparent half shell 7.

The distance $W_1$ between first side face 51 and the second side face 58 defines the width $W_1$ of the housing 100. The arrow denoted with $W_2$ in FIG. 1B indicates the distance between the inner surface 53 of the first side wall 50 and the inner surface 57 of the second side wall 52.

The second transparent curved portion 17 has an outer surface 13 and an inner surface 14. The outer surface 13 of the second transparent curved portion 17 has a convex curvature and curves from the front face 19 to the outer surface 58 of the second side wall 52, in a plane defined by the depth $D_1$ and the width $W_1$ of the transparent shell 5.

The inner surface 14 of the second transparent curved portion 17 has a convex curvature and curves from the inner surface 18 of the front wall 16 to the inner surface 57 of the second side wall 52 in a plane defined by the depth $D_1$ and the width $W_1$ of the transparent shell 5.

The arc of curvature of both the outer surface 13 and inner surface 14 of the second transparent curved portion 17 increases as the second transparent curved portion 17 extends from the front wall 16 to the second side wall 52. In the illustrated example, the arc of curvature of the inner surface 14 of the second transparent curved portion 17 increases at a faster rate than the arc of curvature of the outer surface 13, which means that the thickness of the second transparent curved portion 17 increases as it extends from the front wall 16 to the second side wall 52. Consequently, the thickness $r_2$ of the second side wall 52 is greater than the thickness $r_1$ of the front wall 16.

As can be seen from FIG. 1A, the front wall 16 extends along the whole of the length $L_1$ of the transparent shell 5. The first transparent curved portion 15 and the second transparent curved portion 17 are curved walls which also extend along the whole of the length $L_1$ of the transparent shell 5.

In the example illustrated in FIGS. 1A, 1B and 1C, the first transparent half shell 6 is joined to the second transparent half shell 7 at each of the side walls 50, 52. The reference numerals 54 and 56 indicate the discontinuities where the first transparent half shell 6 is attached to the second transparent half shell 7. In the example illustrated in FIGS. 1A, 1B and 1C, the discontinuities 54, 56 extend along the whole of the length of the transparent shell $L_1$. The first transparent half shell 6 may, for example, be directly adhered to the second transparent half shell 7 at the discontinuities 54, 56.

The second half shell 7 comprises a third transparent curved portion 25, a transparent rear wall 26 and a fourth transparent curved portion 27. The third transparent curved portion 25, the transparent rear face 26 and the fourth transparent curved portion 27 are integrally formed.

In the example illustrated in FIGS. 1A, 1B and 1C, there are no apertures in the third transparent curved portion 25, the transparent rear wall 26 and the fourth transparent curved portion 27. For example, there is no aperture for a camera.

The rear wall 26 is positioned intermediate the third transparent curved portion 25 and the fourth transparent curved portion 27. An outer surface 29 of the rear wall 26 provides the rear face of the housing 100. In the illustrated example, at least a portion of the rear face 29 is substantially flat. The rear wall 26 has an inner surface 28 and a thickness $r_1$. In this example, the rear wall 26 has the same thickness $r_1$ as the front wall 16.

The distance $D_1$ between the rear face 29 and the front face 19 defines the depth $D_1$ of the housing 100. The arrow denoted $D_2$ indicates the distance between the inner surface 18 of the front wall 16 and the inner surface 28 of the rear wall 26.

The third transparent curved portion 25 is configured to curve from the rear wall 26 to the first side wall 50 of the housing 100. The third transparent curved portion 25 has an outer surface 21 and an inner surface 22. The outer surface 21 of the third transparent curved portion 25 has a convex curvature and curves from the rear face 29 to the first side face 51, in a plane defined by the depth $D_1$ and the width $W_1$ of the transparent shell 5. The inner surface 22 of the third transparent curved portion 25 has a convex curvature and curves from the inner surface 28 of the rear wall 26 to the inner surface 53 of the first side wall 50, in a plane defined by the depth $D_1$ and the width $W_1$ of the transparent shell 5.

The arc of curvature of both the outer surface 21 and the inner surface 22 of the third transparent curved portion 25 increases as the third transparent curved portion 25 extends from the rear wall 26 to the first side wall 50. In the illustrated first example, the arc of curvature of the inner surface 22 of the third transparent curved portion 25 increases at a faster rate than the arc of curvature of the outer surface 21, which means that the thickness of the third transparent curved portion 22 increases as it extends from the rear wall 26 to the first side wall 50. Consequently, the thickness $r_2$ of the first side face 50 is greater than the thickness $r_1$ of the rear face 26.

The fourth transparent curved portion 27 is configured to curve from the rear wall 26 to the second side wall 52 of the housing 100. The fourth transparent curved portion 27 has an outer surface 23 and an inner surface 24. The outer surface 23 of the fourth transparent curved portion 27 has a convex curvature and curves from the rear face 26 to the second side face 58, in a plane defined by the depth $D_1$ and the width $W_1$ of the transparent shell 5. The inner surface 24 of the fourth transparent curved portion 27 has a convex curvature and curves from the inner surface 28 of the rear wall 26 to the inner surface 57 of the second side wall 52, in a plane defined by the depth $D_1$ and the width $W_1$ of the transparent shell 5.

The arc of curvature of both the outer surface 23 and the inner surface 14 of the fourth transparent curved portion 27 increases as the fourth transparent curved portion 27 extends from the rear face 26 to the second side face 52. In the illustrated example, the arc of curvature of the inner surface 24 of the fourth transparent curved portion 27 increases at a faster rate than the arc of curvature of the outer surface 23, which means that the thickness of the fourth transparent curved portion 27 increases as it extends from the rear wall 26 to the second side wall 52. Consequently, the thickness $r_2$ of the second side face 52 is greater than the thickness $r_1$ of the front face 16.

The rear wall 26 extends along the whole of the length $L_1$ of the transparent shell 5. The third transparent curved portion 25 and the fourth transparent curved portion 27 are curved walls which also extend along the whole of the length $L_1$ of the transparent shell 5.

It can be seen from FIG. 1B that, in this example, the first transparent curved portion 15 is symmetrical with the second transparent curved portion 17 and the third transparent curved portion 25. The second transparent curved portion 17 is symmetrical with the fourth transparent curved portion 27. The third transparent curved portion 25 is symmetrical with the fourth transparent curved portion 27.

In the example illustrated in FIGS. 1A, 1B and 1C the transparent shell 5 is tubular in shape and includes first and second openings 40, 42 at each end of the length $L_1$ of the transparent shell 5.

The first opening 40, positioned at an upper end of the length of the transparent shell 5, is defined by a first outer rim 30, 32 of the first and second half shells 6, 7. A portion 30 of the circumference of the first outer rim is provided by the first transparent curved portion 15, the front wall 16 and the second transparent curved portion 17. A further portion 32 of the circumference of the first outer rim is provided by the third transparent curved portion 25, the rear wall 26 and the fourth transparent curved portion 27.

The first outer rim 30, 32 is substantially perpendicular to the length $L_1$ of the transparent shell 5. The first outer rim 30, 32 comprises a recess 8 at the front wall 16.

The second opening 40, positioned at a lower end of the length of the transparent shell 5, is defined by a second outer rim 34, 36 of the first and second half shells 6, 7. A portion 34 of the circumference of the second outer rim is provided by the first transparent curved portion 15, the front wall 16 and the second transparent curved portion 17. A further portion 36 of the circumference of the second outer rim is provided by the third transparent curved portion 25, the rear wall 26 and the fourth transparent curved portion 27.

The second outer rim 34, 36 is substantially perpendicular to the length $L_1$ of the transparent shell 5. The second outer rim 34, 36 comprises a recess 9 at the front wall 16.

Figure 2:
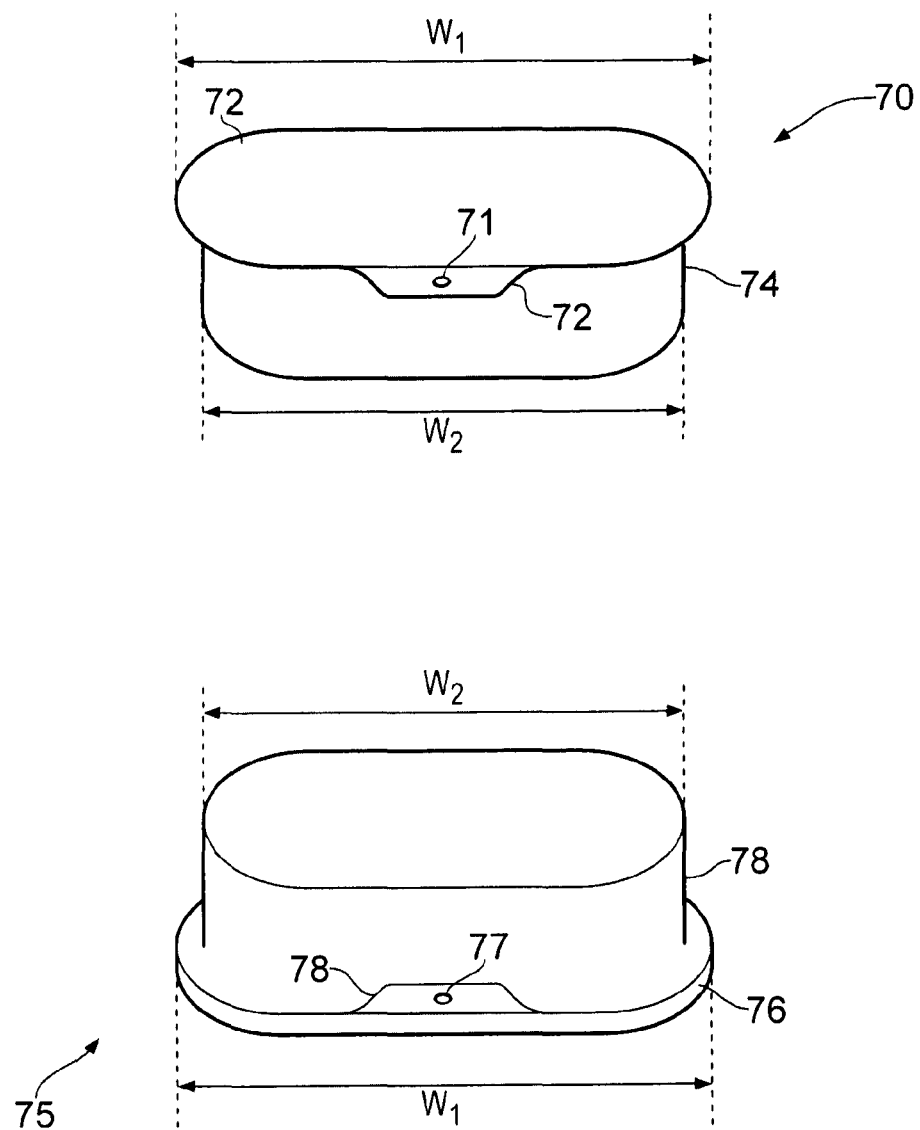
FIG. 2 illustrates first and second end caps.

FIG. 2 illustrates a first end cap 70 and a second end cap 75. The first end cap 70 comprises a first, upper, portion 72 and a second, lower, portion 74. The second portion 74 is shaped for insertion into the first opening 40 and is configured to hold the first end cap 70 in place. In this regard, the second portion 74 has a width $W_2$ substantially corresponding with the distance between the inner surfaces 53, 57 of the two side walls 50, 52 of the transparent shell 5 and a depth $D_2$ substantially corresponding with the distance between the inner surfaces 18, 28 of the front wall 16 and the rear wall 26 (see FIG. 1B). The second portion 74 is dimensioned to enable a push-fit connection to be provided between the lower portion 74 of the first end cap 70 and the inner surfaces 12, 14, 18, 22, 24, 28 of the transparent shell 5. Friction prevents the lower portion 74 of the first end cap 70 from falling out of the first opening 40 once it has been inserted.

The first portion 72 of the first end cap 70 is shaped to cover the first outer rim 30, 32 of the transparent shell 5 and the first opening 40. In this regard, the first portion 72 has a width $W_1$ substantially corresponding with the distance between the two side faces 51, 58 of the transparent shell 5 and a depth $D_1$ substantially corresponding with the distance between the front face 19 and the rear face 29 (see FIG. 1B).

The first end cap 70 is configured to house an audio device, such as a loudspeaker/earpiece. The first end cap 70 further comprises a third portion 72 that protrudes outwardly, in the depth direction, from the second portion 74. The third portion 72 is shaped to fit into the recess 8 in the first outer rim 30, 32 of the first transparent half shell 6. The third portion 72 comprises an aperture 71 for the audio device housed in the first end cap 70. For example, if the audio device is a loudspeaker, the aperture enables sound waves produced by the loudspeaker to exit the first end cap 70.

The second end cap 75 comprises a first, upper, portion 78 and a second, lower, portion 76. The first portion 78 is shaped for insertion into the second opening 42 and is configured to hold the second end cap 75 in place. In this regard, the first portion 78 has a width $W_2$ substantially corresponding with the distance between the inner surfaces 53, 57 of the two side walls 50, 52 of the transparent shell 5 and a depth $D_2$ substantially corresponding with the distance between the inner surfaces 18, 28 of the front wall 16 and the rear wall 26 (see FIG. 1B). The first portion 78 is dimensioned to enable a push-fit connection to be provided between the upper portion 78 of the second end cap 75 and the inner surfaces 12, 14, 18, 22, 24, 28, 53, 57 of the transparent shell 5. Friction prevents the upper portion 78 of the second end cap 75 from falling out of the second opening 42 once it has been inserted.

The second portion 76 of the second end cap 75 is shaped to cover the second outer rim 34, 36 of the transparent shell 5 and the second opening 42. In this regard, the second portion 76 has a width $W_1$ substantially corresponding with the distance between the two side faces 51, 58 of the transparent shell 5 and a depth $D_1$ substantially corresponding with the distance between the front face 19 and the rear face 29 (see FIG. 1B).

The second end cap 75 is configured to house an audio device, such as a microphone. The second end cap 75 further comprises a third portion 78 that protrudes outwardly, in the depth direction, from the first portion 78. The third portion 78 is shaped to fit into the recess 9 in the second outer rim 34, 36 of the first transparent half shell 6. The third portion 78 comprises an aperture 77 for the audio device housed in the second end cap 75. For example, if the audio device is a microphone, the aperture enables sound waves produced by a user to reach the diaphragm of the microphone.

Figure 3:
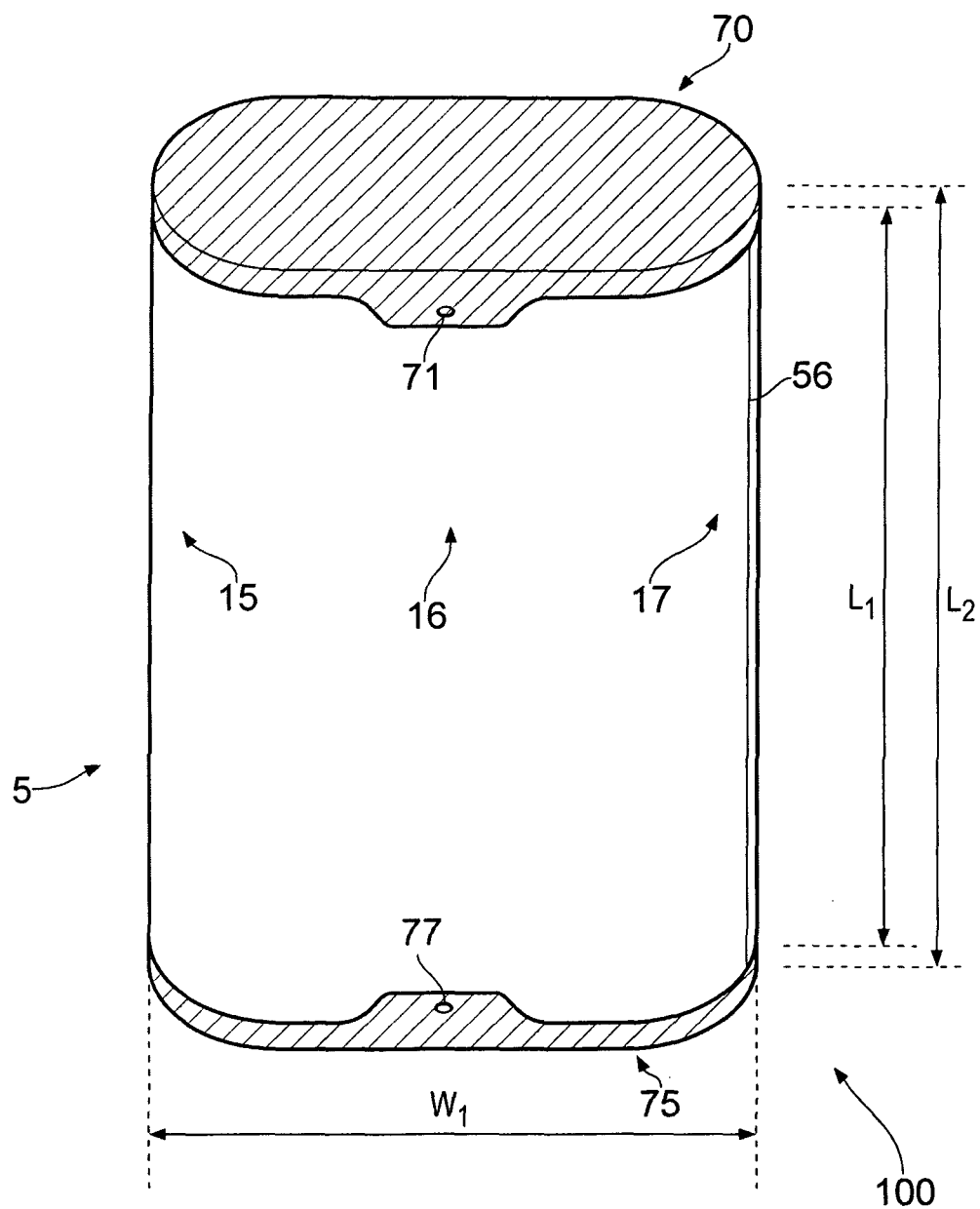
FIG. 3 illustrates the housing comprising the first and second end caps.

FIG. 3 illustrates the housing 100 with the first and second end caps 70, 75 in position. The housing 100 illustrated in FIG. 3 has a length $L_2$ which is a little longer than the length of the transparent shell $L_1$.

It can be seen from FIG. 3 that, in this exemplary embodiment of the invention, the only apertures in the housing 100 are those in the first and second end caps 70, 75. The presence of the apertures 71, 77 in the end caps 70, 75 for a loudspeaker and a microphone means that it is not necessary for such apertures to be present in the transparent shell 5. An advantageous technical effect of this is that the transparent shell 5 is stronger than it would be if such apertures were present in the transparent shell 5.

It can also be seen from FIG. 3 that the first and second end caps 70, 75 are positioned to cover the first and second outer rims 30, 32, 34, 36 of the transparent shell 5. A technical effect of the first and second end caps 70, 75 and their positioning is that they protect the first and second outer rims 30, 32, 34, 36 from being damaged in the event that the housing 100 is dropped. This is particularly advantageous if the transparent shell 5 is made from a brittle material, such as glass.

Figure 4:
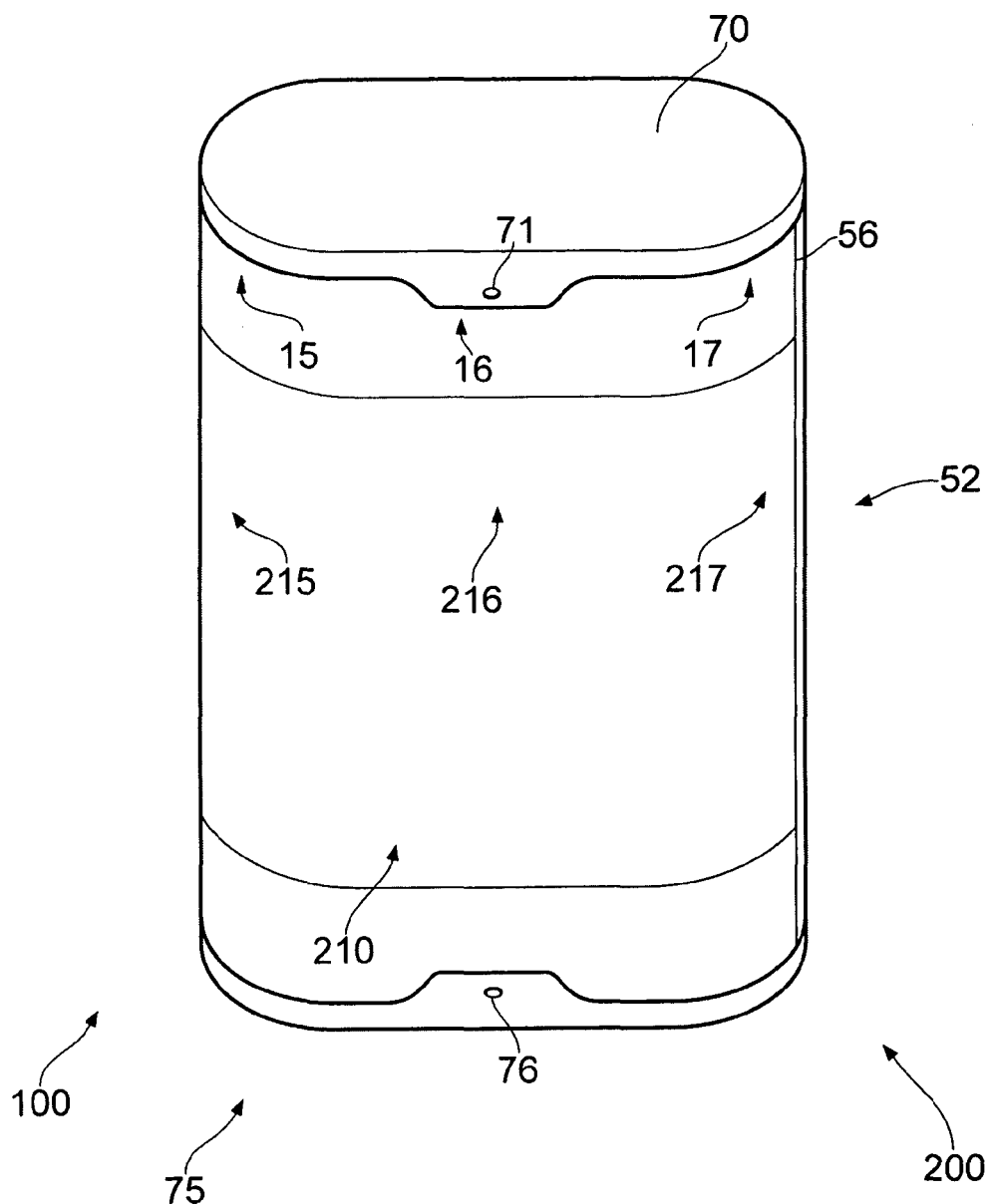
FIG. 4 illustrates a front view of a portable electronic device.

FIG. 4 illustrates a portable electronic device 200 comprising the housing 100 illustrated in FIGS. 1A to 3. In this particular example, the portable electronic device 200 comprises a curved display 210. The transparency of the curved transparent portions 15, 17 of the housing 100 enables a curved display 210 to be provided.

The curved display 210 may, for example, be an organic light emitting diode (OLED) display. The curved display 210 may be a touch sensitive display. The display 210 may, for example, operate using capacitive technology. The curved display 210 comprises a first curved portion 215, a substantially flat portion 216 and a second curved portion 217.

The first curved portion 215 of the display 210 is configured to curve in register with the first transparent curved portion 15 of the transparent shell 5. For example, the curvature of the first curved portion 215 may follow the curvature of the inner surface 12 of the first transparent curved portion 15 of the transparent shell 5.

The second curved portion 217 of the display 210 is configured to curve in register with the second transparent curved portion 17 of the transparent shell 5. For example, the curvature of the second curved portion 217 may follow the curvature of the inner surface 14 of the second transparent curved portion 17 of the transparent shell 5.

In the example illustrated in FIG. 4, the curved display 210 extends across the first transparent portion 15, the front wall 16 and the second transparent curved portion 17. It terminates at the discontinuities 54, 56, at the side walls 50, 52 of the housing 100.

In some alternative embodiments of the invention, at least some of the display 210 may extend across the side walls 50, 52 and the third and fourth transparent curved portions 25, 27 of the transparent shell 5. For example, at least some of the display 210 may curve in register with the third and fourth transparent curved portions 25, 27. It may be that the display 210 extends around the whole circumference of the transparent shell 5, including the rear wall 26.

It will be appreciated by those skilled in the art, however, that embodiments of the invention are not restricted to the use of a curved display 210 such as that illustrated in FIG. 4. Instead, a flat display may be provided.

Since the shell 5 of the housing 100 is transparent, it is not necessary to have an aperture for the display 210. The display 210 is viewable through the transparent shell 5. An advantageous technical effect of not having such an aperture is that the housing 100 is stronger than it would be if such an aperture were present.

Figure 5:
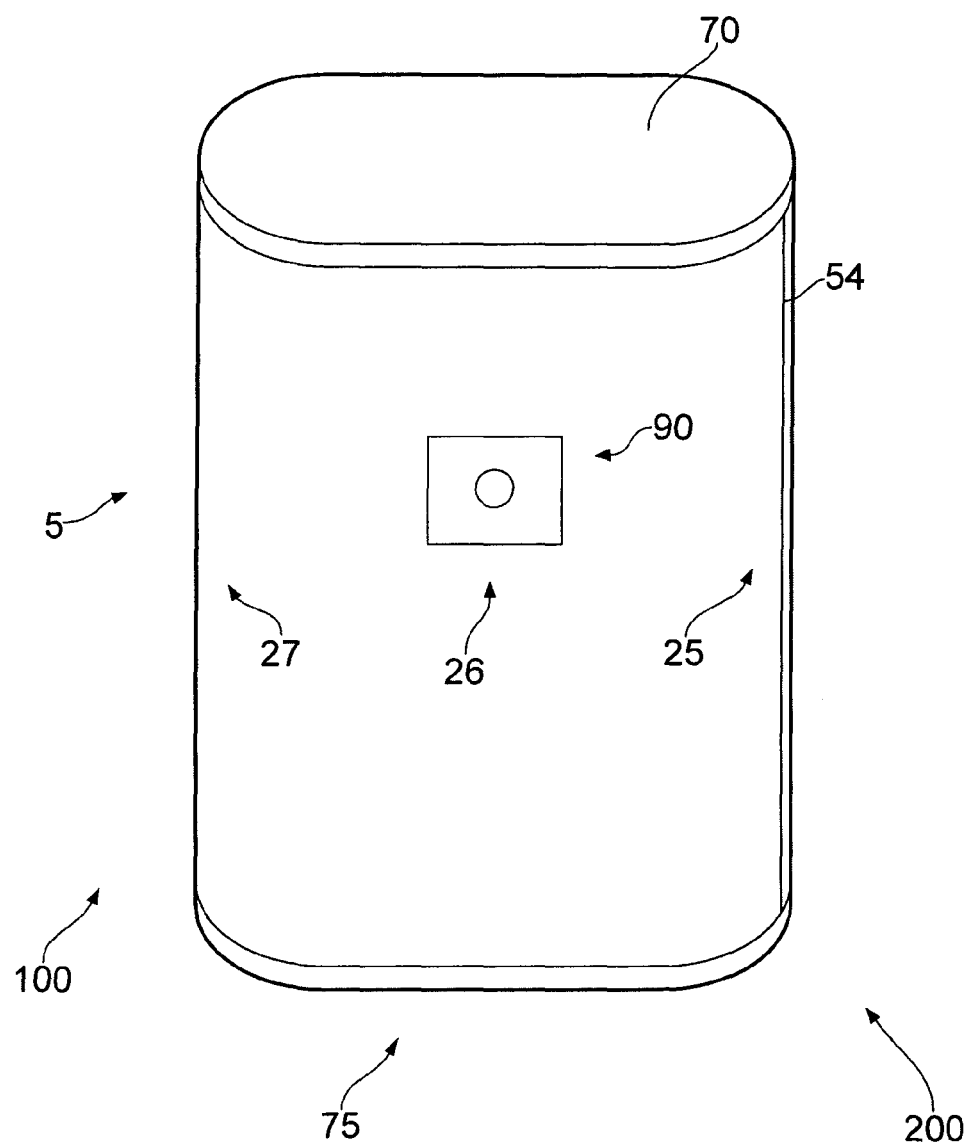
FIG. 5 illustrates a rear view of a portable electronic device.

FIG. 5 illustrates a rear view of the portable electronic device 200. In the illustrated example, the portable electronic device 200 comprises a camera 90. The portable electronic device 200 may also comprise flash circuitry. The transparent shell 5 does not comprise an aperture for the camera. Images may be captured through the transparent rear face 26 of the shell 5. Also, the flash circuitry may provide light directly through the transparent shell 5.

In some alternative embodiments of the invention, one or both of the camera 90 and the flash circuitry may be housed in one of the end caps 70, 75. In these embodiments, an end cap 70, 75 may comprise one or more apertures for the camera 90 and/or the flash circuitry.

Figure 6:
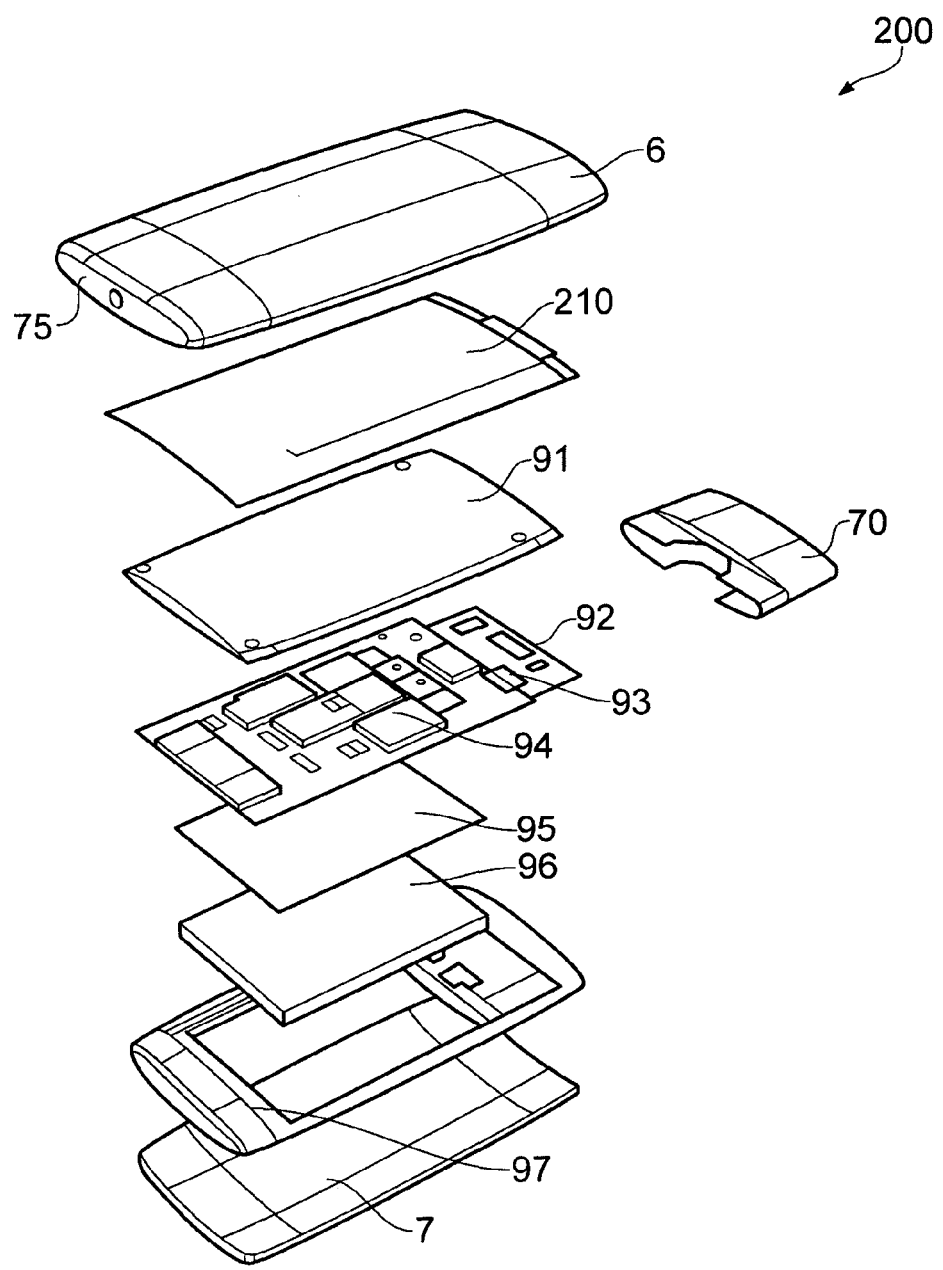
FIG. 6 illustrates an exploded view of a portable electronic device.

FIG. 6 illustrates an exploded view of an exemplary portable electronic device 200 according to embodiments of the invention. FIG. 6 illustrates one example of how such a portable electronic device 200 may be constructed.

In the FIG. 6 example, the portable electronic device 200 comprises a first transparent half shell 6. A flat, borderless, touch sensitive display 210 is positioned directly beneath the first transparent half shell 6. The display 210 is fixed to a display support plate 91 which may, for example, be made from metal.

An upper printed wiring board 92 is electrically connected to a lower printed wiring board 94 by a connector 93. In this example, the upper printed wiring board 92 is located in the first end cap 70 and comprises an earpiece/loudspeaker, an integrated handsfree, and a micro Universal Serial Bus (USB) chipset.

A battery 96 is adhered to the lower printed wiring board 94 using adhesive 95. The battery 96 sits, at least partially, in an antenna carrier 97 which comprises one or more antennas. The antenna carrier 7 is positioned adjacent to the transparent second half shell 7. In this example, a printed member may be present between the antenna carrier 97 and the second half shell 7 to prevent the antenna carrier 97 and/or the battery 96 from being visible to the user.

Figure 7:
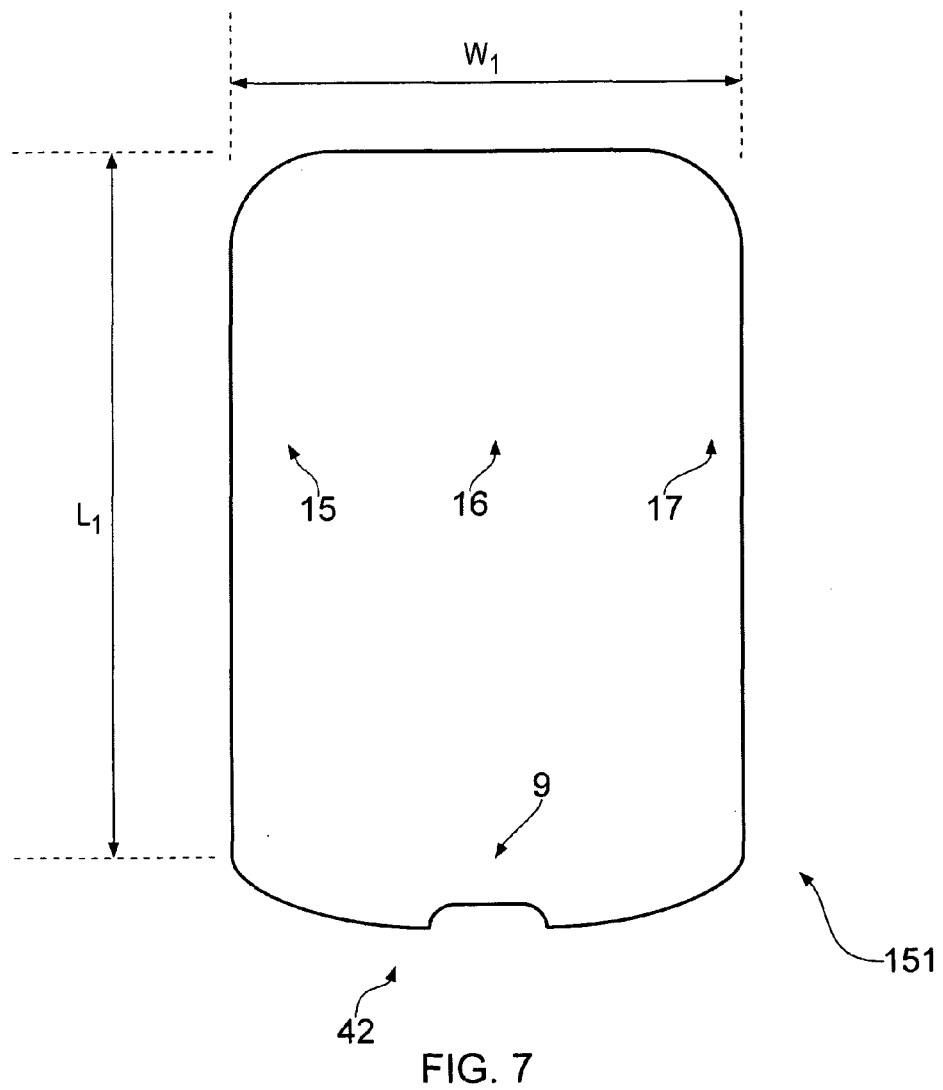
FIG. 7 illustrates a front view of an alternative housing.

FIG. 7 illustrates an alternative embodiment of the transparent shell 151 which comprises only one opening 42 at the lower end of the shell 151. In this example, there is no opening at the upper end of the shell 151. In some further alternative embodiments of the invention, the opening 42 may not be present and the transparent shell 5 may be 'closed'.

Although embodiments of the present invention have been described in the preceding paragraphs with reference to various examples, it should be appreciated that modifications to the examples given can be made without departing from the scope of the invention as claimed. For example, the front face 19 and the rear face 29 are illustrated in the figures as being substantially flat. However, in some embodiments of the invention, at least a portion of the front face 19 and/or the rear face 29 may be curved. The side faces 51, 58 are illustrated in the figures as being curved, but in alternative embodiments of the invention they may be substantially flat or include substantially flat portions.

The transparent shell 5 is described above as being made up of two half shells 6, 7 that are joined together. In some alternative embodiments of the invention, the transparent shell 5 may be integrally formed, such that the discontinuities 54, 56 are not present.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. A housing for a portable electronic device comprising:
a first transparent half shell having a first curved portion, a front wall and a second curved portion, wherein an outer surface of the front wall provides a front face, the first curved portion is configured to curve from the front face of the housing to a first side face of the housing, and the second curved portion is configured to curve from the front face to a second side face of the housing;
a second transparent half shell having a third curved portion, a rear wall and a fourth curved portion, wherein an outer surface of the rear wall provides a rear face, the third curved portion is configured to curve from the rear face to the first side face, and the fourth curved portion is configured to curve from the rear face to the second side face,
wherein the housing has a length, a width and a depth in which the length is greater than the width and the depth, and the housing has an opening, at least partially defined by an outer rim of the first, second, third and fourth transparent curved portions, at one end of the length.

2. A housing as claimed in claim 1, wherein the first and second side faces of the housing extend along the length of the housing.

3. A housing as claimed in claim 1, wherein the distance between the first side face and the second side face defines the width of the housing.

4. A housing as claimed in claim 3, wherein the distance between the front face and the rear face defines the depth of the housing, and the depth is smaller than the width.

5. A housing as claimed in claim 1, wherein the front wall is positioned intermediate the first transparent curved portion and the second transparent curved portion, and wherein the front wall, the first transparent curved portion and the second transparent curved portion are integrally formed.

6. A housing as claimed in claim 1, wherein the rear is positioned intermediate the third transparent curved portion and the fourth transparent curved portion, and wherein the rear wall, the third transparent portion and the fourth transparent portion are integrally formed.

7. A housing as claimed in claim 1, wherein the first half shell is joined to the second half shell at the first side face and the second side face.

8. A housing as claimed in claim 7, wherein the first half shell is adhered directly to the second half shell at the first side face and the second side face.

9. A housing as claimed in claim 1, wherein the first, second, third and fourth curved portions are made from transparent material.

10. A housing as claimed in claim 1, further comprising an end cap positioned to cover the opening and the outer rim, wherein the end cap is configured to house an audio device.

11. A housing as claimed in claim 1, wherein the housing has a further opening, at least partially defined by a further outer rim of the first, second, third and fourth transparent portions, at a further end of the housing.

12. A housing as claimed in claim 11, further comprising a further end cap positioned to cover the further opening and the further outer rim, wherein the further end cap is configured to house a further audio device.

13. A portable electronic device comprising the housing as claimed in claim 1, and further comprising a display, viewable through the front face of the housing, wherein the display has a first curved portion in register with the first transparent curved portion of the housing, and a second curved portion in register with the second transparent curved portion of the housing.

14. A housing as claimed in claim 1, wherein the first half shell and the second half shell are wholly made from a transparent smooth material, and each half shell is integrally formed.

15. A housing as claimed in claim 14, wherein the transparent smooth material is glass.

16. A housing as claimed in claim 1, wherein the first half shell and the second half shell are wholly made from a transparent plastics material, and each half shell is integrally formed.

17. A housing for a portable electronic device, comprising:
a transparent shell having a length, a width and a depth, wherein the transparent shell comprises a first opening at one end of the length and a second opening at a second end of the length, and wherein the first opening is defined by a first outer rim of the transparent shell and the second opening is defined by a second outer rim of the transparent shell; and a first end cap configured to cover the first opening, wherein the first end cap comprises an aperture for a loudspeaker, a second end cap positioned to cover the second opening and the second outer rim, wherein the second end cap comprises an aperture for a microphone, wherein the transparent shell comprises a first transparent half shell and a second transparent half shell, and at least one of the first outer rim and the second outer rim is formed by the first and second half shells.

18. A housing as claimed in claim 17, wherein the transparent shell comprises an outer rim, substantially perpendicular to the length, defining the first opening, and the first end cap is shaped to cover the outer rim defining the first opening.

19. A housing as claimed in claim 17, wherein the first end cap comprises a portion that extends into the transparent shell and holds the end cap in place.

20. A housing for a portable electronic device, comprising:

a transparent shell having a length, a width and a depth, wherein the transparent shell comprises a first half shell and a second half shell, the first half shell has a first curved portion, a front wall and a second curved portion, the first curved portion curves from the front wall to a first side wall of the housing, the second curved portion curves from the front wall to a second side wall of the housing, and there are no apertures in the first curved portion, the front wall or the second curved portion;

the second half shell has a third curved portion, a rear wall and a fourth curved portion, the third curved portion curves from the rear wall to the first side wall of the housing, the fourth curved portion curves from the rear wall to the second side wall of the housing, and there are no apertures in the third curved portion, the rear wall or the fourth curved portion; and the transparent shell comprises an opening at one end of the length, the opening being defined by an outer rim of the transparent shell, a first portion of the outer rim being provided by the first half shell and second portion of the outer rim being provided by the second half shell; and an end cap positioned to cover the opening and the outer rim.

* * * * *